(12) United States Patent
Tseng et al.

(10) Patent No.: US 9,525,107 B2
(45) Date of Patent: Dec. 20, 2016

(54) SEMICONDUCTOR LIGHT-EMITTING DEVICE AND FABRICATING METHOD THEREOF

(71) Applicant: Formosa Epitaxy Incorporation, Taoyuan County (TW)

(72) Inventors: Chia-Yu Tseng, Hsinchu County (TW); Yu-Hsuan Liu, Taoyuan County (TW)

(73) Assignee: EPISTAR CORPORATION, Hsinchu (TW)

( * ) Notice: Subject to any disclaimer, the term of this patent is extended or adjusted under 35 U.S.C. 154(b) by 78 days.

(21) Appl. No.: 14/494,606

(22) Filed: Sep. 24, 2014

(65) Prior Publication Data
US 2015/0108532 A1    Apr. 23, 2015

(30) Foreign Application Priority Data
Oct. 22, 2013   (TW) .................. 102138148

(51) Int. Cl.
*H01L 33/38* (2010.01)
*H01L 33/00* (2010.01)
*H01L 33/44* (2010.01)
*H01L 33/42* (2010.01)

(52) U.S. Cl.
CPC ............. *H01L 33/38* (2013.01); *H01L 33/005* (2013.01); *H01L 33/44* (2013.01); *H01L 33/42* (2013.01); *H01L 2933/0016* (2013.01)

(58) Field of Classification Search
CPC .......... H01L 33/10; H01L 33/38; H01L 33/42; H01L 33/44; H01L 33/46; H01L 33/54
See application file for complete search history.

(56) References Cited

U.S. PATENT DOCUMENTS 6,483,123 B1 *  11/2002  Kim .................... H01L 27/3248
                                                                257/40
2010/0252859 A1 *  10/2010  Son ........................ H01L 33/02
                                                                257/103

* cited by examiner

*Primary Examiner* — Tucker J Wright
(74) *Attorney, Agent, or Firm* — Muncy, Geissler, Olds & Lowe, P.C.

(57) ABSTRACT

A semiconductor light-emitting device including a light-emitting semiconductor structure, a transparent dielectric pattern and an electrode pattern is provided. The light-emitting semiconductor structure includes a first semiconductor layer, a second semiconductor layer disposed opposite to the first semiconductor layer and a light-emitting layer disposed between the first semiconductor layer and the second semiconductor layer. The transparent dielectric pattern is disposed above at least one portion of the light-emitting semiconductor structure. The electrode pattern is disposed above the transparent dielectric pattern. At least one cave is formed between the transparent dielectric pattern and the light-emitting semiconductor structure. The cave is disposed opposite to the electrode pattern. Moreover, a fabricating method of the semiconductor light-emitting device is also provided.

20 Claims, 8 Drawing Sheets

SEMICONDUCTOR LIGHT-EMITTING DEVICE AND FABRICATING METHOD THEREOF

CROSS-REFERENCE TO RELATED APPLICATION

This application claims the priority benefit of Taiwan application serial no. 102138148, filed on Oct. 22, 2013. The entirety of the above-mentioned patent application is hereby incorporated by reference herein and made a part of this specification.

BACKGROUND OF THE PRESENT INVENTION

Field of the Present Invention

The present invention relates to a light-emitting device and a fabricating method thereof, and more particularly, relates to a semiconductor light-emitting device and a fabricating method thereof.

Description of Related Art

Distinct from the light-emitting theory of regular fluorescent lamps or incandescent lamps generating heat to emit light, the light-emitting theory of semiconductor light-emitting devices is based on the specific property of semiconductor to emit light. Accordingly, the semiconductor light-emitting devices have advantages of long service life and low power consumption. In addition, the semiconductor light-emitting devices are also free of harmful substance (such as mercury) to further provide advantages of environmental protection.

The semiconductor light-emitting device includes a light-emitting semiconductor structure and an electrode pattern disposed on the light-emitting semiconductor structure. Generally, the electrode pattern is a metal electrode which shields light. However, when a light beam emitted by a light-emitting semiconductor structure is transmitted to the outside, part of the light beam is absorbed by the metal electrode to affect an external light extraction efficiency of the light-emitting semiconductor structure. Therefore, it has now become an important issue as how to reduce a probability of the light beam absorbed by the metal electrode, so as to enhance the external light extraction efficiency of the light-emitting semiconductor structure.

SUMMARY OF THE PRESENT INVENTION

The present invention provides a semiconductor light-emitting device which has improved external light extraction efficiency, and a fabricating method of the semiconductor light-emitting device.

A semiconductor light-emitting device according to the present invention includes a light-emitting semiconductor structure, a transparent dielectric pattern and an electrode pattern. The light-emitting semiconductor structure includes a first semiconductor layer, a second semiconductor layer disposed opposite to the first semiconductor layer and a light-emitting layer disposed between the first semiconductor layer and the second semiconductor layer. The transparent dielectric pattern is disposed above at least one portion of the light-emitting semiconductor structure. The electrode pattern is disposed above the transparent dielectric pattern. At least one cave is formed between the transparent dielectric pattern and the light-emitting semiconductor structure, and located opposite to the electrode pattern.

The fabricating method of said semiconductor light-emitting device includes the following steps: providing a light-emitting semiconductor structure; forming a transparent dielectric pattern above at least one portion of the light-emitting semiconductor structure; forming a cave between the transparent dielectric pattern and the light-emitting semiconductor structure; and forming an electrode pattern above the transparent dielectric pattern.

In an embodiment of the present invention, walls of said cave are constituted by the transparent dielectric pattern and the light-emitting semiconductor structure.

In an embodiment of the present invention, said cave is structured by a top cover portion, a side wall portion formed by the transparent dielectric pattern, and the light-emitting semiconductor structure. The side wall portion is disposed between the top cover portion and the light-emitting semiconductor structure.

In an embodiment of the present invention, said cave includes an opening. An opening direction of the opening is intersected with a direction perpendicular to the light-emitting layer.

In an embodiment of the present invention, a transverse section width of said cave is not less than a corresponding transverse section width of the electrode pattern.

In an embodiment of the present invention, said semiconductor light-emitting device further includes a transparent conductive layer. The transparent conductive layer is disposed between the transparent dielectric pattern and the electrode pattern. The transparent conductive layer covers the transparent dielectric pattern, the cave and the at least one portion of the light-emitting semiconductor structure.

In an embodiment of the present invention, said cave includes a plurality of caves.

In an embodiment of the present invention, the fabricating method of the semiconductor light-emitting device further includes forming a definition pattern above the at least one portion of the light-emitting semiconductor structure before forming the transparent dielectric pattern, and then the transparent dielectric pattern is formed above the definition pattern and exposing at least one side wall of the definition pattern.

In an embodiment of the present invention, said cave is formed by making an etchant to contact the exposed side wall of the definition pattern.

In an embodiment of the present invention, the etchant is capable of etching the definition pattern and incapable of etching the transparent dielectric pattern.

Based on above, in the semiconductor light-emitting device according to an embodiment of the present invention, the cave formed between the transparent dielectric pattern and the light-emitting semiconductor structure may be utilized to reflect or refract at least a part of the light beam emitted by the light-emitting semiconductor structure at the boundary of the cave, so that the light beam may be deflected away from the electrode pattern. Accordingly, the probability of the light beam absorbed by the electrode pattern may be decreased, and the external light extraction efficiency of the semiconductor light-emitting device may be significantly enhanced.

To make the above features and advantages of the disclosure more comprehensible, several embodiments accompanied with drawings are described in detail as follows.

DESCRIPTION OF THE EMBODIMENTS

In order reduce the probability of the light beam absorbed by a metal electrode of a semiconductor light-emitting device, one of technical means is to optimize a disposition of the metal electrode, including to dispose the metal electrode on the edge of light-emitting surface of the semiconductor light-emitting device, or to use different metal electrode patterns to prevent a major light-emitting of the semiconductor light-emitting device from being shielded by the metal electrode. However, because a driving current flows between the metal electrode and the light-emitting semiconductor structure by taking the shortest path, major light-emitting positions are located at (or adjacent to) places directly under the metal electrode. Accordingly, the light-emitting of the semiconductor light-emitting device may still be shielded, and the disposition of the metal electrode is still one of major factors affecting a light-emitting efficiency of the semiconductor light-emitting device. In order to overcome such defect, the new technology development is mainly carried out in two directions: one is to change a path of the driving current, and the other one is to reduce a contact area between the metal electrode and the light-emitting semiconductor structure. A technical means of changing the path of the driving current is, based on the above technical means, to dispose a current blocking layer between the metal electrode and the light-emitting semiconductor structure to change a direction of the driving current flow, so as to move the major light-emitting positions to reduce the probability of the light beam absorbed by the metal electrode. On the other hand, another technical means for reducing the contact area between the metal electrode and the light-emitting semiconductor structure requires to reserve a specific area for the metal electrode to meet conditions and restrictions of feasibility in back-end process of packaging and soldering. In this method, a metal electrode pattern is shaped as a tree having branches to optimize the light-emitting efficiency of the semiconductor light-emitting device, or a structure of the metal electrode is changed to have T-shape or Γ-shape in cross section view. Although the above technical means may indeed enhance the light-emitting efficiency of the semiconductor light-emitting device, in a fabrication process of actual products, these means may increase the complexity of the fabrication process, manufacturing costs and yield rate of the products. For example, a lithography process must be included to form the metal electrode with specific shape. As another example, in the back-end process of packaging, it is also very important as how to maintain a structural shape of the metal electrode during the process of wire bonding or soldering without causing deformations. In view of above, there are some difficulties in realizing the above-said technical means.

Figure 1A:
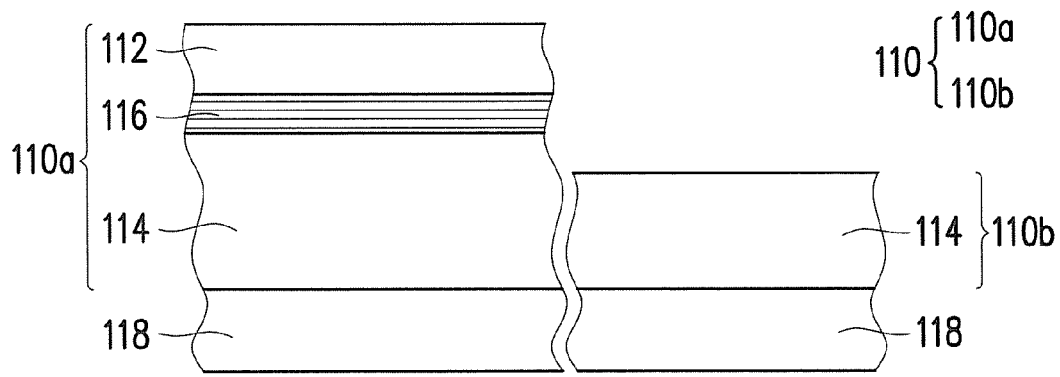
FIG. 1A to FIG. 1F are schematic diagrams illustrating a fabricating method of a semiconductor light-emitting device according to an embodiment of the present invention.

In order to solve various problems as mentioned above, a fabricating method of a semiconductor light-emitting device according to an embodiment of the present invention is provided with reference to schematic diagrams of FIG. 1A to FIG. 1F. Referring to FIG. 1A, first, a light-emitting semiconductor structure 110 is provided. The light-emitting semiconductor structure 110 includes a first semiconductor layer 112, a second semiconductor layer 114 disposed opposite to the first semiconductor layer 112, and a light-emitting layer 116 disposed between the first semiconductor layer 112 and the second semiconductor layer 114. In the present embodiment, at least one portion of the second semiconductor layer 114 is exposed from the first semiconductor layer 112 and the light-emitting layer 116, and the exposed portion of the second semiconductor layer 114 constitutes a second region 110b of the light-emitting semiconductor structure 110. In addition, another part of the second semiconductor layer 114 covered by the first semiconductor layer 112 and the light-emitting layer 116 is stacked with the first semiconductor layer 112 and the light-emitting layer 116 to form a first region 110a of the light-emitting semiconductor structure 110. The semiconductor light-emitting device according to the present embodiment may further include a substrate 118. Accordingly, the second semiconductor layer 114, the light-emitting layer 116 and the first semiconductor layer 112 are sequentially formed on the substrate 118 by using an epitaxial growth method. In this case, the second semiconductor layer 114, the light-emitting layer 116 and the first semiconductor layer 112 are overlapped with one another. Next, an etching method is used to remove part of the first semiconductor layer 112 and part of the light-emitting layer 116 to expose at least one portion of the second semiconductor layer 114, so as to form the second region 110b and the first region 110a. However, the present invention is not limited thereto. In other embodiment, other methods may also be used to provide the light-emitting semiconductor structure 110. For example, the substrate 118 is removed instead of removing the part of the first semiconductor layer 112 and the part of the light-emitting layer 116 on the second semiconductor layer 114, such that at least one portion of the second semiconductor layer 114 can be exposed. In addition, in the present embodiment, the first semiconductor layer 112 may be a P-type semiconductor layer while the second semiconductor layer 114 may be a N-type semiconductor layer, or vice versa. Nonetheless, the present invention is not limited to the above.

Figure 1B:
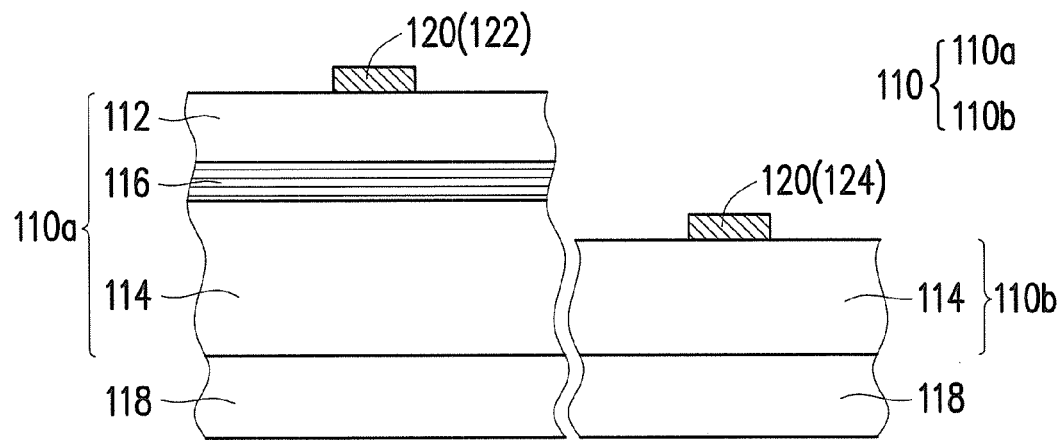

Referring to FIG. 1B, subsequently, a definition pattern 120 is formed above the light-emitting semiconductor structure 110. In the present embodiment, the definition pattern 120 may further include a first definition pattern 122 and a second definition pattern 124 distinct from the first definition pattern 122. The first definition pattern 122 is formed on the first region 110a and connected with the first semiconductor layer 112. The second definition pattern 124 is formed on the second region 110b and connected with the second semiconductor layer 114. In the present embodiment, a material of the definition pattern 120 may be Cr, Ni, or Ti. However, the present invention is not limited thereto. In other embodiments, the definition pattern 120 may also be other appropriate materials.

Figure 1C:
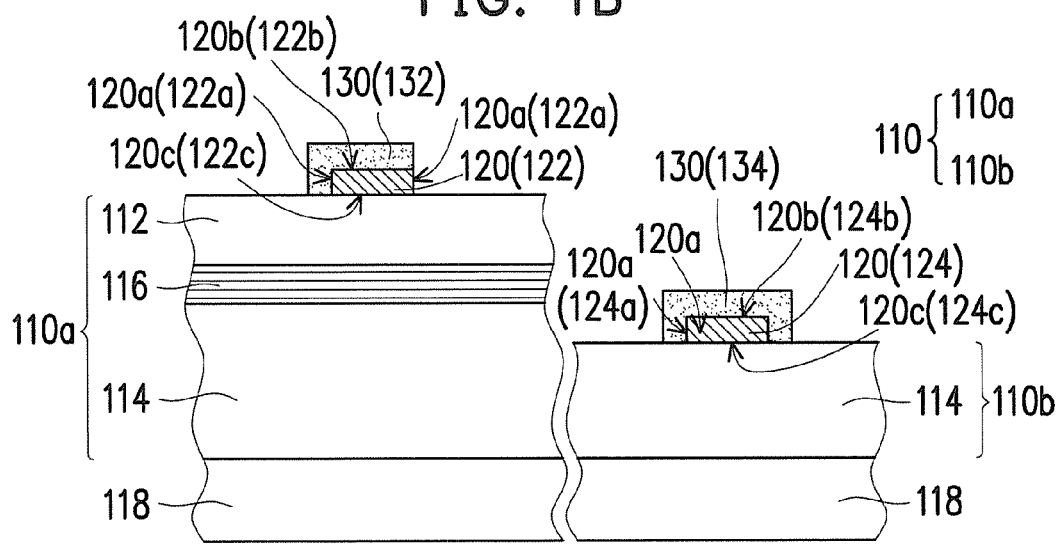

Referring to FIG. 1C, subsequently, a transparent dielectric pattern 130 is formed above the definition pattern 120. The transparent dielectric pattern 130 extends from the top of the definition pattern 120 down to the part of the light-emitting semiconductor structure 110 outside the definition pattern 120. In addition, the transparent dielectric pattern 130 further exposes at least one side wall 120a of the definition pattern 120. To be specific, the definition pattern 120 includes a bottom surface 120c facing toward the light-emitting semiconductor structure 110, a top surface 120b opposite to the light-emitting semiconductor structure 110, and a plurality of side walls 120a located between the top surface 120b and the bottom surface 120c. In the present embodiment, the transparent dielectric pattern 130 covers the top surface 120b, the bottom surface 120c and at least one of the side walls 120a, and exposes at least another one of the side walls 120a.

In the present embodiment as shown in FIG. 1C, the transparent dielectric pattern 130 may further include a first transparent dielectric pattern 132 and a second transparent dielectric pattern 134 distinct from the first transparent dielectric pattern 132. The first transparent dielectric pattern 132 is formed above the first definition pattern 122. The first transparent dielectric pattern 132 extends from the top of the first definition pattern 122 down to the part of the first semiconductor layer 112 outside the first definition pattern 122. The first transparent dielectric pattern 132 covers a top surface 122b of the first definition pattern 122 opposite to the first semiconductor layer 112, a bottom surface 122c of the first definition pattern 122 facing toward the first semiconductor layer 112 and at least one side wall 122a of the first definition pattern 122 located between the top surface 122b and the bottom surface 122c, and exposes at least another one of the side walls 122a of the first definition pattern 122. The second transparent dielectric pattern 134 is formed above the second definition pattern 124. The second transparent dielectric pattern 134 extends from the top of the second definition pattern 124 down to the part of the second semiconductor layer 114 outside the second definition pattern 124. The second transparent dielectric pattern 134 covers a top surface 124b of the second definition pattern 124 opposite to the substrate 118, a bottom surface 124c of the second definition pattern 124 facing toward the substrate 118 and at least one side wall 124a of the second definition pattern 124 located between the top surface 124b and the bottom surface 124c, and exposes at least another one of the side walls 124a of the second definition pattern 124. In the present embodiment, a material of the transparent dielectric pattern 130 may be an oxide, nitride or other compound, and include an element selected from a group consisting of silicon, titanium, and aluminum (e.g., $SiO_x$, $SiN_x$, $SiON_x$, $TiO_x$ or $Al_2O_3$). However, the present invention is not limited thereto. In other embodiments, the transparent dielectric pattern 130 may also be other appropriate materials.

Figure 1D:
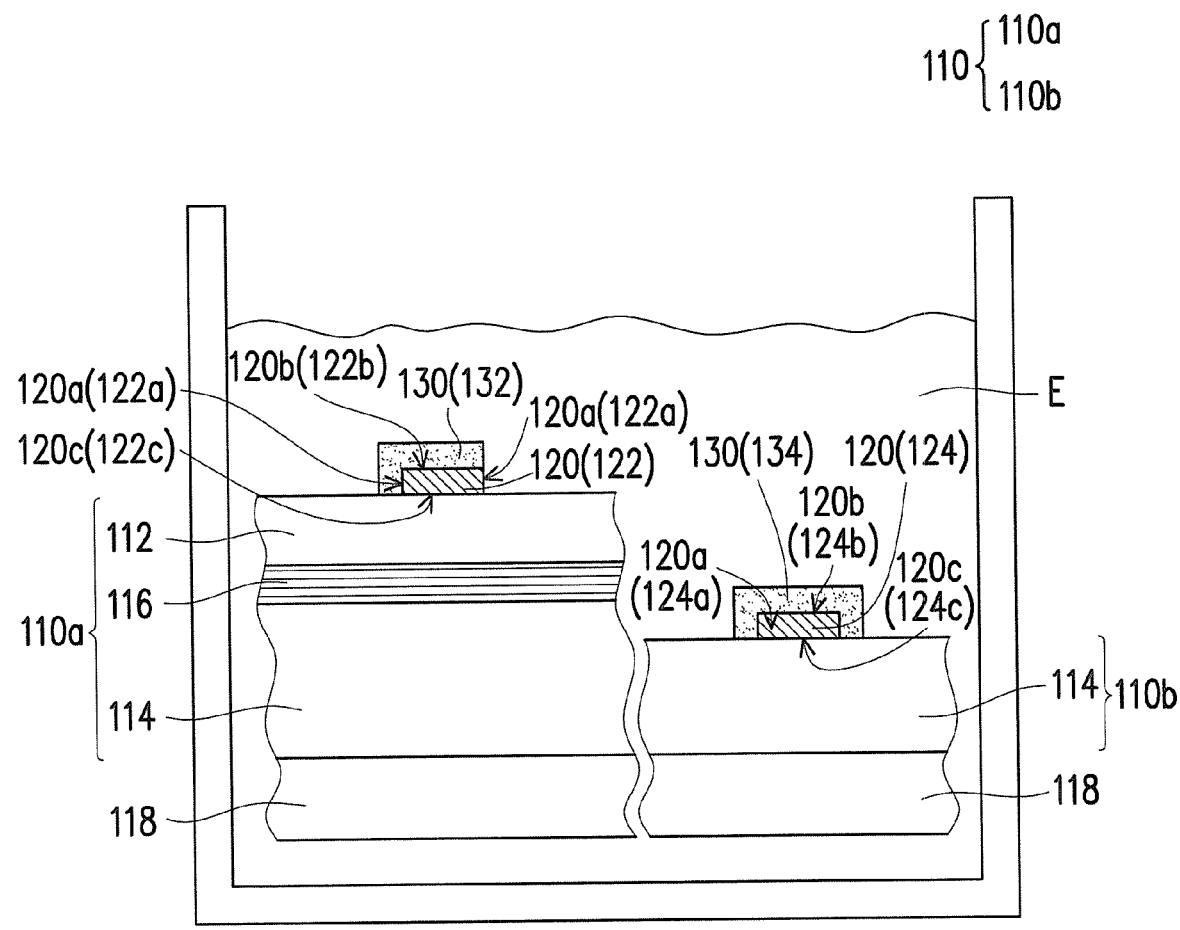
Figure 1E:
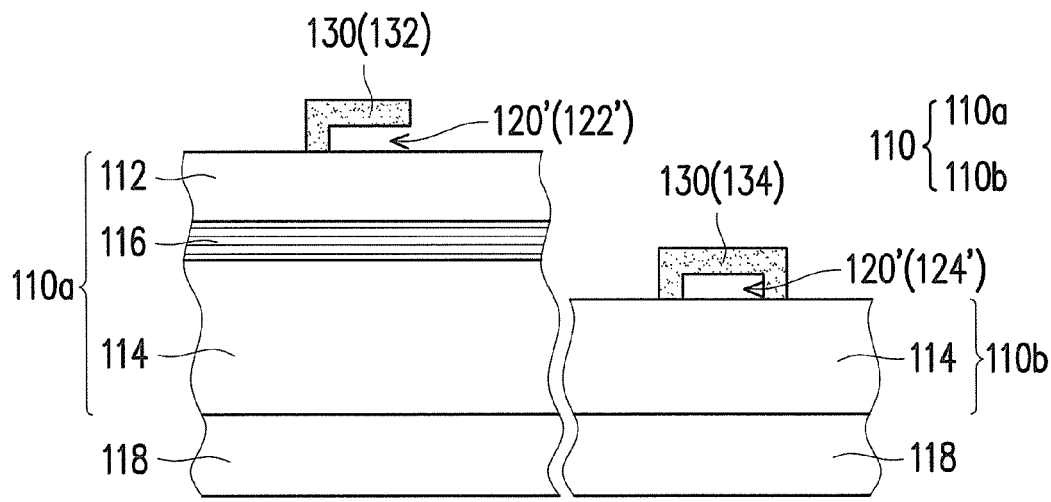

Referring to FIG. 1D and FIG. 1E, subsequently, a cave 120' (illustrated in FIG. 1E) is formed at a position where the definition pattern 120 was located. To be specific, as shown in FIG. 1D, in the present embodiment, a semi finished product of the semiconductor light-emitting device as shown in FIG. 1C is soaked in an etchant E (illustrated in FIG. 1D), so as to make the etchant E to contact the exposed side wall 120a of the definition pattern 120 exposed by the transparent dielectric pattern 130. Accordingly, the definition pattern 120 is removed by the etchant E, and the cave 120' can be formed at the position where the definition pattern 120 was originally located. The composition of the etchant E may be decided according to the materials of the definition pattern 120 and the transparent dielectric pattern 130. More specifically, any etchant capable of etching the definition pattern 120 and incapable of etching the transparent dielectric pattern 130 may be used as the etchant E.

As shown in FIG. 1E, in the present embodiment, the cave 120' may further include a first cave 122' and a second cave 124' distinct from the first cave 122'. The walls of the first cave 122' are constituted by the first transparent dielectric pattern 132 and the first semiconductor layer 112. The walls of the second cave 124' are constituted by the second transparent dielectric pattern 134 and the second semiconductor layer 114. In other words, the cave 120' is structured by a top cover portion 130a formed by the transparent dielectric pattern 130, a side wall portion 130b formed by the transparent dielectric pattern 130 and the light-emitting semiconductor structure 110. However, a quantity of the cave 120' is not limited by the present invention.

Figure 1F:
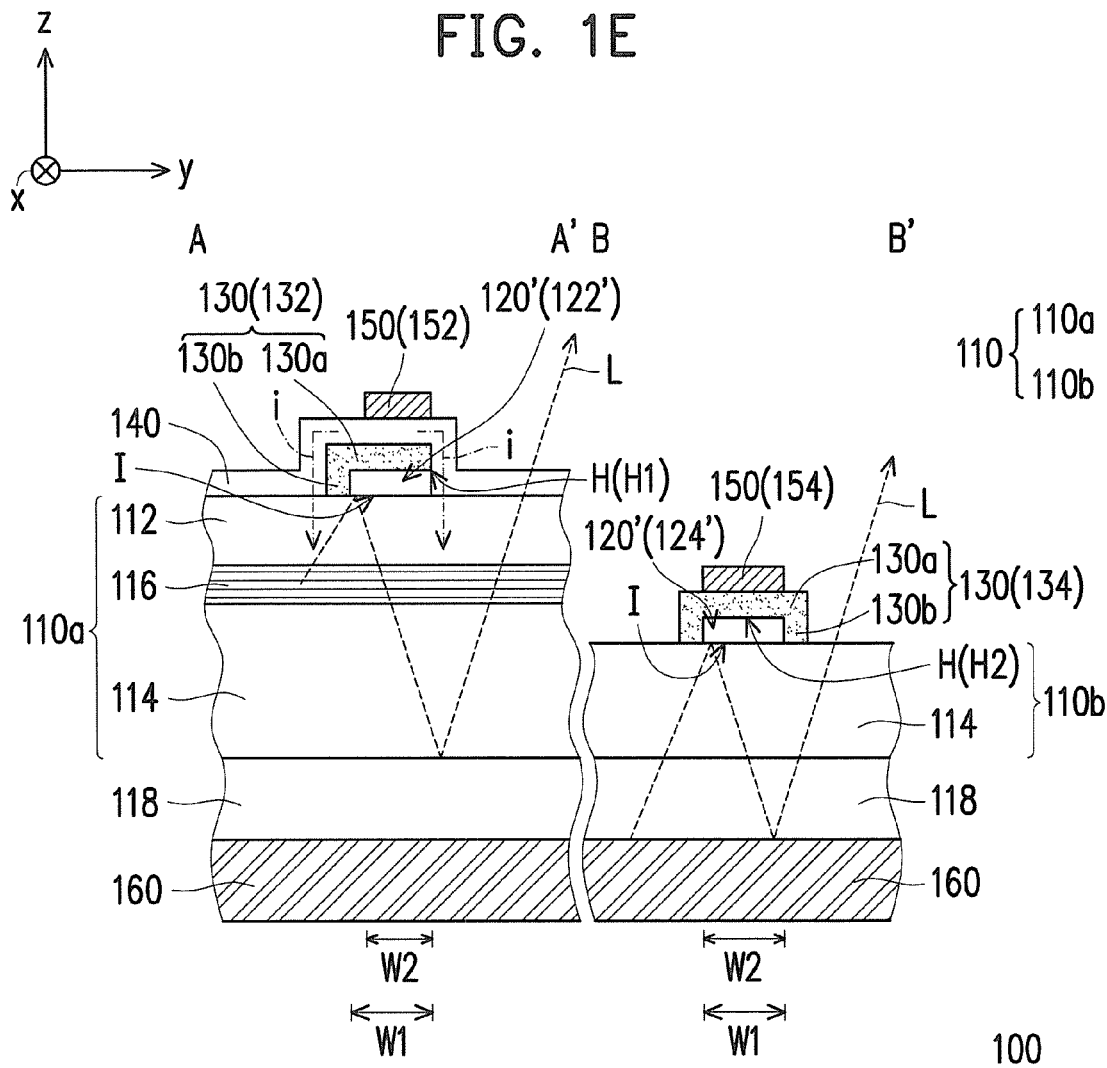

Referring to FIG. 1F, subsequently, in the present embodiment, a transparent conductive layer 140 may be selectively formed on the first transparent dielectric pattern 132. The transparent conductive layer 140 extends from the top of the first transparent dielectric pattern 132 along a plurality of sides of the first transparent dielectric pattern 132 down to the part of the first semiconductor layer 112 outside the first transparent dielectric pattern 132, and blocks an opening H1 of the first cave 122'. In the present embodiment, a material of the transparent conductive layer 140 may include an element selected from a group consisting of indium tin oxides, indium zinc oxides, aluminum tin oxides, aluminum zinc oxides and germanium indium zinc oxides. However, the present invention is not limited thereto. In other embodiments, the material of the transparent conductive layer 140 may also be other appropriate materials.

Referring back to FIG. 1F, subsequently, an electrode pattern 150 is formed above the transparent dielectric pattern 130. To be specific, in the present embodiment, the electrode pattern 150 may further include a first electrode 152 and a second electrode 154 distinct from the first electrode 152. The first electrode 152 is disposed above the first cave 122' and located corresponding to the first cave 122'. The second electrode 154 is disposed above the second cave 124' and located corresponding to the second cave 124'. In the present embodiment, the electrode pattern 150 may be a metal stacked-layer or alloy, and a material of the electrode pattern 150 may include an element selected from a group consisting of chromium, titanium, nickel, silver, gold, platinum, palladium, rhodium, radium, tungsten or aluminum. However, the present invention is not limited thereto. The electrode pattern 150 may also be other appropriate materials.

Further, in another embodiment, a reflection layer 160 may be selectively formed on the light-emitting semiconductor structure 110, wherein the light-emitting semiconductor structure 110 is disposed between the cave 120' and the reflection layer 160. In the present embodiment, the reflection layer 160 is formed after the process of the electrode pattern 150. However, the present invention is not limited thereto. In other embodiments, the reflection layer 160 may be formed after the process of the cave 120' but before the process of the electrode pattern 150, or be formed at other appropriate timing. Thereby, the semiconductor light-emitting device 100 according to the present embodiment is realized.

Figure 2:
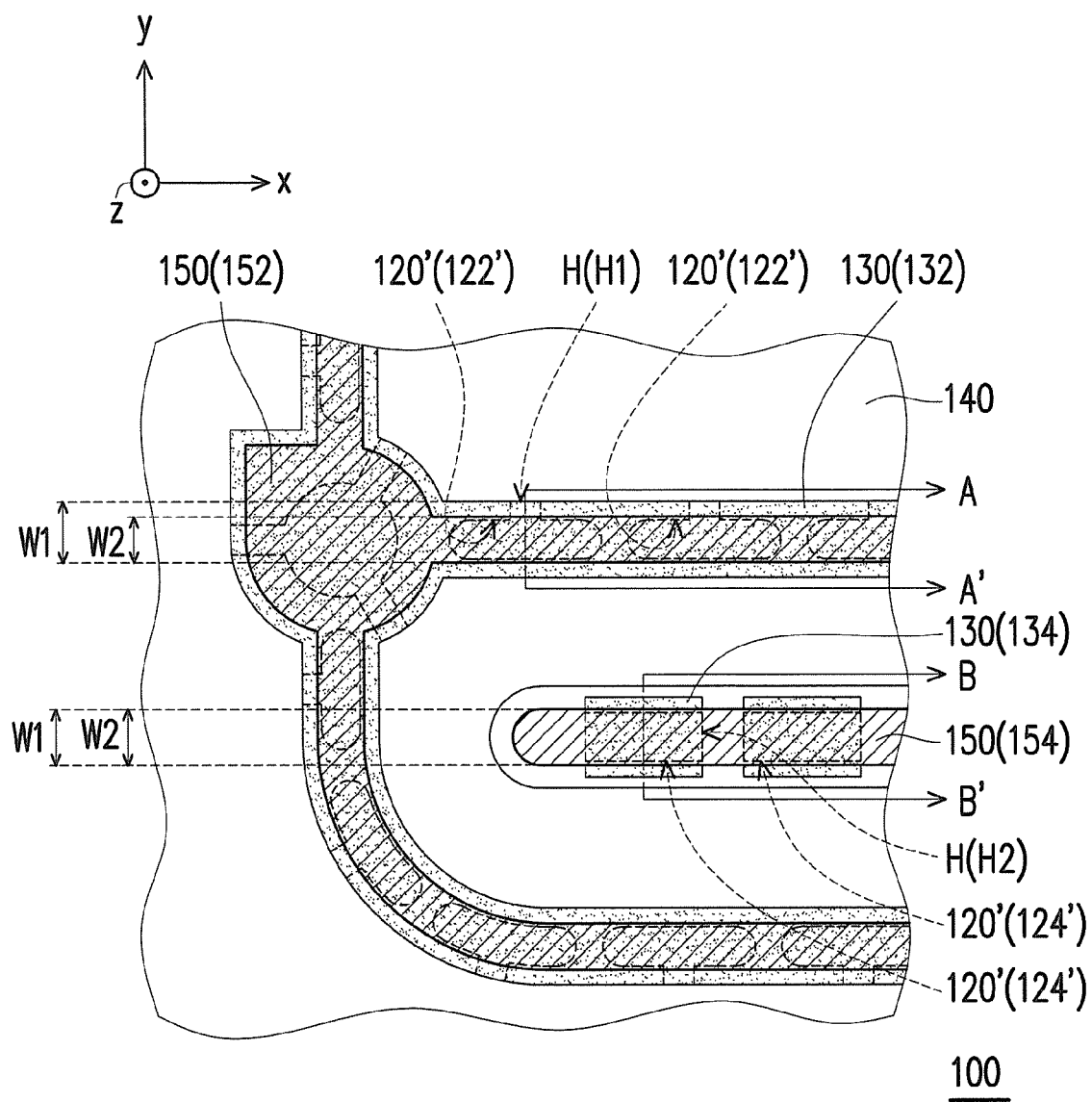
FIG. 2 is a top view schematic diagram illustrating a semiconductor light-emitting device according to an embodiment of the present invention.

FIG. 2 is a top view schematic diagram illustrating a semiconductor light-emitting device according to an embodiment of the present invention. Particularly, FIG. 1F is corresponding to cutting lines A-A' and B-B' of FIG. 2. Referring to FIG. 1F and FIG. 2, the semiconductor light-emitting device 100 includes the light-emitting semiconductor structure 110, the transparent dielectric pattern 130 disposed above the light-emitting semiconductor structure 110 and the electrode pattern 150 disposed above the transparent dielectric pattern 130. The transparent dielectric pattern 130 is disposed between the electrode pattern 150 and the light-emitting semiconductor structure 110. More than one caves 120' are formed between the transparent dielectric pattern 130 and the light-emitting semiconductor structure 110, and opposite to the electrode pattern 150, wherein at least one of side walls of the cave 120' is parallel to an edge of the corresponding part of the electrode pattern 150 thereon.

In the present embodiment as shown in FIG. 2, the transparent dielectric pattern 130 may further include a first transparent dielectric pattern 132 and a second transparent dielectric pattern 134 distinct from the first transparent dielectric pattern 132. The first transparent dielectric pattern 132 is disposed above the first semiconductor layer 112. More specifically, the first transparent dielectric pattern 132 is disposed on the first region 110a of the light-emitting semiconductor structure 110 to connect with the first semiconductor layer 112. The second transparent dielectric pattern 134 is disposed above the second semiconductor layer 114. More specifically, the second transparent dielectric pattern 134 is disposed on the second region 110b of the light-emitting semiconductor structure 110 to connect with the second semiconductor layer 114.

In the present embodiment as shown in FIG. 2, at least one cave 120' is formed between at least one of the transparent dielectric patterns 132, 134 and the light-emitting semiconductor structure 110. In the present embodiment, the cave 120' may further include a plurality of caves 120' arranged in equidistant interval. In one of other embodiments of the present invention, the caves 120' may further include a first cave 122' and a second cave 124'. The first cave 122' is formed between the first transparent dielectric pattern 132 and the first semiconductor layer 112. The second cave 124' is formed between the second transparent dielectric pattern 134 and the second semiconductor layer 114. In other words, the transparent dielectric pattern 130 may include more than one transparent dielectric pattern, and the at least one cave 120' is formed between each one of the transparent dielectric pattern 130 and the light-emitting semiconductor structure 110. However, the present invention is not intended to limit that the cave 120' must be formed between each one of the transparent dielectric pattern 130 and the light-emitting semiconductor structure 110. It falls within the scope of the present invention for which protection is sought as long as the semiconductor light-emitting device includes any cave formed on the light-emitting semiconductor structure, and structured by using the transparent dielectric pattern. In the following descriptions, other semiconductor light-emitting devices that fall within the scope of the present invention are provided by reference with FIG. 3 to FIG. 6.

In the present embodiment as shown in FIG. 2, a plurality of the caves 120' are located opposite to at least one of the electrodes 152, 154. The caves 120' may include a first cave 122' and a second cave 124'. The first electrode 152 is disposed opposite to the first cave 122' and covering the first cave 122'. The second electrode 154 is disposed opposite to the second cave 124' and covering the second cave 122'. Furthermore, in the present embodiment, at least a portion of the first electrode 152 is overlapped with at least one portion of the first cave 122' in a direction z perpendicular to the substrate 118, and the first cave 122' may exceed outside the first electrode 152 from top view. However, the present invention is not limited thereto. In other embodiments, take the viewpoint in the direction z; it is possible that the first cave 122 does not exceed outside the first electrode 152. In the present embodiment, at least a portion of the second electrode 154 is overlapped with at least one portion of the second cave 124' in the direction z perpendicular to the substrate 118, and the second cave 124' may not exceed outside the second electrode 152 from top view. However, the present invention is not limited thereto. In other embodiments, take the viewpoint in the direction z; it is possible that the second cave 124 exceeds outside the second electrode 154.

In the present embodiment as shown in FIG. 2, the cave 120' includes an opening H. An opening direction of the opening H is intersected with the direction z perpendicular to the light-emitting layer 116. To be specific, as shown in FIG. 2, the opening direction of the opening H1 of the first cave 122' (the direction y) is perpendicular to an extended tangent direction of a corresponding portion of the first electrode 152 (the direction x), and the opening direction of an opening H2 of the second cave 124' (the direction x) is parallel to an extended tangent direction of a corresponding portion of the second electrode 154 (the direction x). In addition, in the present embodiment, a transverse section width W1 of the cave 120' is not less than a transverse section width W2 of the electrode pattern 150, wherein the transverse section width W1 refers to a width of the cave 120' in the direction y parallel to the substrate 118, and the transverse section width W2 refers to a width of a corresponding portion of the electrode pattern 150 in the direction y parallel to the substrate 118. However, the present invention is not limited thereto. The transverse section width W1 of the cave 120' and the transverse section width W2 of the electrode pattern 150 may be adjusted based on actual demands.

The semiconductor light-emitting device 100 according to the present embodiment as shown in FIG. 2 may selectively include the transparent conductive layer 140. The transparent conductive layer 140 is disposed between the transparent dielectric pattern 130 and the electrode pattern 150. The transparent conductive layer 140 selectively covers the transparent dielectric pattern 130, the cave 120' and at least one portion of the light-emitting semiconductor structure 110. To be specific, the transparent conductive layer 140 is disposed between the first transparent dielectric pattern 132 and the first electrode pattern 152. The transparent conductive layer 140 covers the first transparent dielectric pattern 132 and at least one portion of the first semiconductor layer 112. More specifically, the transparent conductive layer 140 extends from the top of the first transparent dielectric pattern 132 down to the part of the first semiconductor layer 112 outside the first transparent dielectric pattern 132, so that the first cave 122' may be structured by the transparent conductive layer 140 and the first transparent dielectric pattern 132.

In addition, the semiconductor light-emitting device 100 of another embodiment may also selectively include the reflection layer 160. The light-emitting semiconductor structure 110 is disposed between the cave 120' and the reflection layer 160. In the present embodiment, the reflection layer 160 is disposed on a side of the substrate 118 where the light-emitting semiconductor structure 110 is not disposed, and the substrate 118 is disposed between the light-emitting semiconductor structure 110 and the reflection layer 160. However, the present invention is not limited thereto. In other embodiments, the reflection layer 160 may also be disposed on the same side of the substrate 118 where the light-emitting semiconductor structure 110 is disposed. For example, the reflection 160 may be disposed between the light-emitting semiconductor structure 110 and the substrate 118.

As described in the above embodiments according to the present invention, a part of a light beam L emitted by the light-emitting layer 116 of the semiconductor light-emitting device 100 of the present invention may be fully reflected, or partially refracted and partially reflected at an boundary I between the cave 120' and another material (e.g., the light-emitting semiconductor structure 110), and emerged from regions outside the electrode pattern 150, as shown in FIG. 1F. In other words, by disposing the cave 120', the part of the light beam L emitted from light-emitting layer 116 to the electrode pattern 150 may be deflected, so as to lower the probability of the light beam L absorbed by the electrode pattern 150. Accordingly, the external light extraction efficiency of the semiconductor light-emitting device 100 may be enhanced.

Moreover, since the value of electrical impedance of the cave 120' and the transparent dielectric pattern 130 is high, all or most of a driving current i applied to the semiconductor light-emitting device 100 can be distributed to the light-emitting layer 116 where is not located directly under the electrode pattern 150, and most of the light beam L induced by the driving current i is emitted thereby. Because, the electrical impedance of the cave 120' and the transparent dielectric pattern 130 may further affect the electrical driving condition of the semiconductor light-emitting device 100, it is capable to adjust the arrangement of the cave 120' or the transparent dielectric pattern 130 according to the application requirement to produce the semiconductor light-emitting device 100 with desired light-emitting effect and electrical condition according to the present invention. For example, in one of preferable embodiments of the present invention, a semiconductor light-emitting device 100 includes a plurality of the first caves 122' arranged in equidistant interval under the first electrode 152 to make a uniform light-emitting effect. In another one of preferable embodiments of the present invention, a plurality of the second caves 124' or the second transparent dielectric pattern 134 may be arranged in equidistant interval under the second electrode 154, wherein a quantity of the second cave 124' covered by each one of second transparent dielectric pattern 134 may be one, or more than one. However, the present invention is not limited thereto, the arrangement of the cave 120' or the transparent dielectric pattern 130 may also be change to a non-equidistant interval arrangement (e.g., a gradually-closer arrangement, a gradually-farther arrangement, or an irregular arrangement) to produce a semiconductor light-emitting device 100 with non-uniform light-emitting effect and different electrical condition.

Accordingly, most part of the light beam L emitted by the light-emitting layer 116 of the semiconductor light-emitting device 100 according to an embodiment of the present invention cannot be shielded by the electrode pattern 150. In other words, the probability of the light beam L absorbed by the electrode pattern 150 may be decreased, and the performance of the semiconductor light-emitting device 100 may be improved without using a special structure or shape of metal electrode pattern as described early while maintaining practicality in the original process or back-end packaging for the semiconductor light-emitting device.

Finally, it should be noted that, the semiconductor light-emitting device according to the present invention is not limited by the embodiments illustrated in FIG. 1F and FIG. 2. The semiconductor light-emitting device according to the present invention may also include embodiments described with reference to FIG. 3, FIG. 4, FIG. 5 and FIG. 6.

Figure 3:
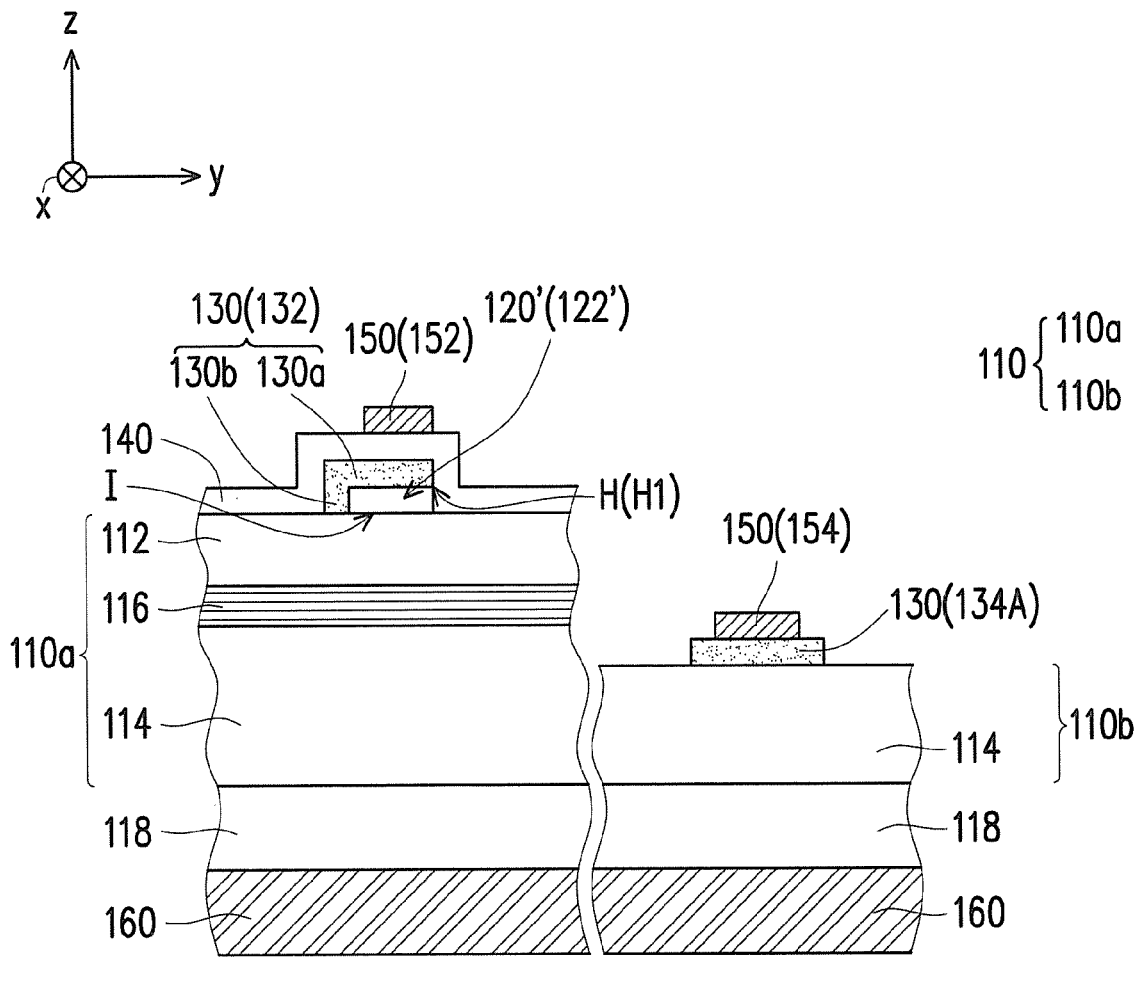
FIG. 3 is a cross-sectional schematic diagram illustrating a semiconductor light-emitting device according to another embodiment of the present invention.

FIG. 3 is a cross-sectional schematic diagram illustrating a semiconductor light-emitting device according to another embodiment of the present invention. A semiconductor light-emitting device 100A show in FIG. 3 is similar to the semiconductor light-emitting device 100 show in FIG. 1F, thus identical elements are indicated by the same reference numbers. A difference between the semiconductor light-emitting device 100A and the semiconductor light-emitting device 100 is that, in the present embodiment, at least one cave 120' is formed between the first transparent dielectric pattern 132 and the light-emitting semiconductor structure 110, and no cave is formed between a second transparent dielectric pattern 134A and the light-emitting semiconductor structure 110.

Figure 4:
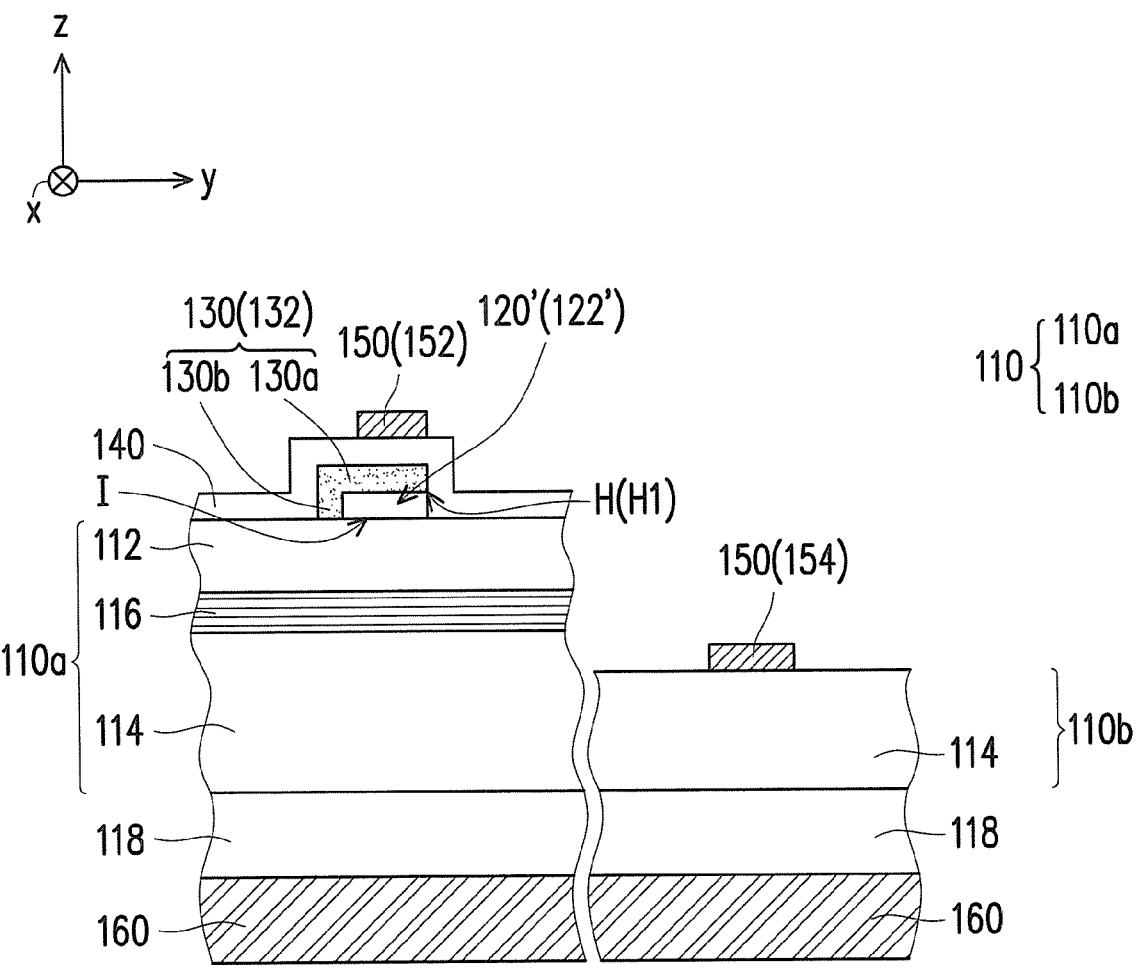
FIG. 4 is a cross-sectional schematic diagram illustrating a semiconductor light-emitting device according to yet another embodiment of the present invention.

FIG. 4 is a cross-sectional schematic diagram illustrating a semiconductor light-emitting device according to yet another embodiment of the present invention. A semiconductor light-emitting device 100B show in FIG. 4 is similar to the semiconductor light-emitting device 100A show in FIG. 3, thus identical elements are indicated by the same reference numbers. A difference between the semiconductor light-emitting device 100B and the semiconductor light-emitting device 100A is that, in the present embodiment, the second transparent dielectric pattern 134A is not disposed between the second electrode 154 and the light-emitting semiconductor structure 110.

Figure 5:
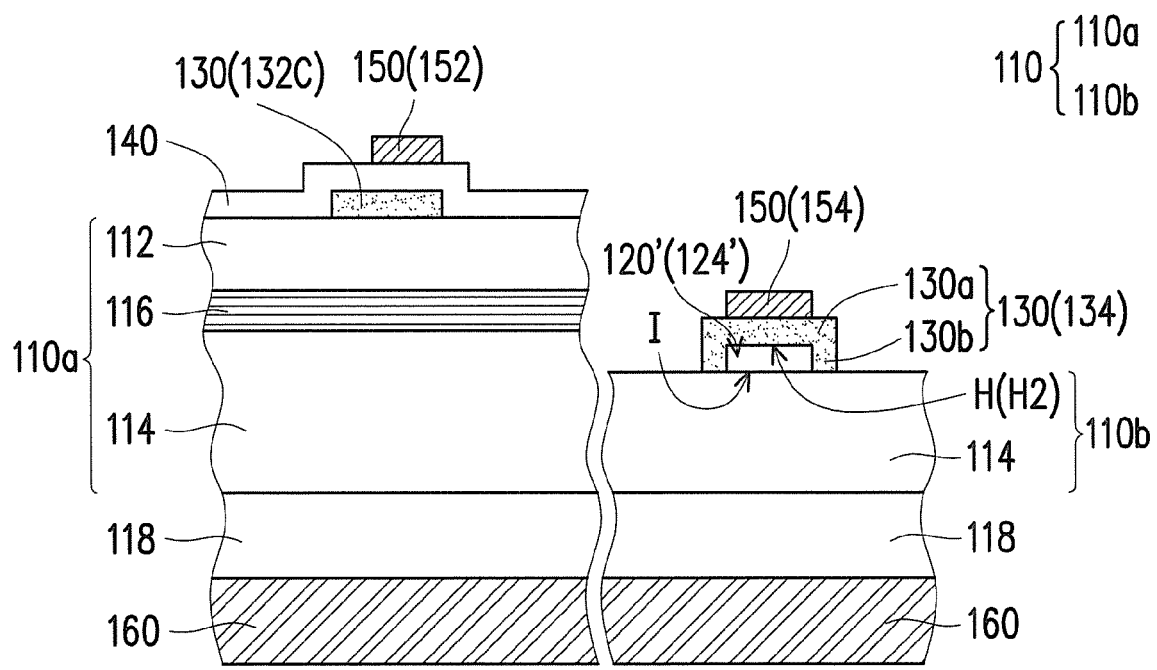
FIG. 5 is a cross-sectional schematic diagram illustrating a semiconductor light-emitting device according to still another embodiment of the present invention.

FIG. 5 is a cross-sectional schematic diagram illustrating a semiconductor light-emitting device according to still another embodiment of the present invention. A semiconductor light-emitting device 100C show in FIG. 5 is similar to the semiconductor light-emitting device 100 show in FIG. 1F, thus identical elements are indicated by the same reference numbers. A difference between the semiconductor light-emitting device 100C and the semiconductor light-emitting device 100 is that, in the present embodiment, no cave is formed between a first transparent dielectric pattern 132C and the light-emitting semiconductor structure 110, and the cave 120' is formed between the second transparent dielectric pattern 134 and the light-emitting semiconductor structure 110.

Figure 6:
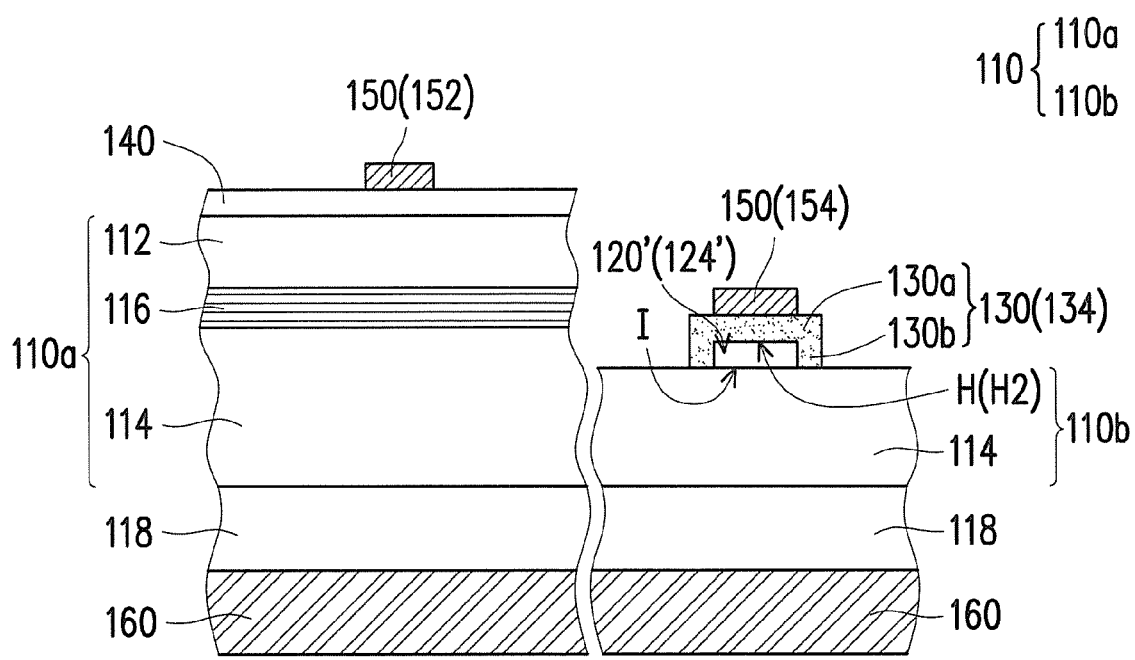
FIG. 6 is a cross-sectional schematic diagram illustrating a semiconductor light-emitting device according to an embodiment of the present invention.

FIG. 6 is a cross-sectional schematic diagram illustrating a semiconductor light-emitting device according to an embodiment of the present invention. A semiconductor light-emitting device 100D show in FIG. 6 is similar to the semiconductor light-emitting device 100C show in FIG. 5, thus identical elements are indicated by the same reference numbers. A difference between the semiconductor light-emitting device 100D and the semiconductor light-emitting device 100C is that, in the present embodiment, the first transparent dielectric pattern 132C is not disposed between the first electrode 152 and the light-emitting semiconductor structure 110.

As described above, the present invention provide a semiconductor light-emitting device having improved performance, and most part of the light beam emitted by the light-emitting layer of the semiconductor light-emitting device according to the present invention cannot be shielded by the electrode pattern. Further, the semiconductor light-emitting device according to the present invention can still be handled in the general process or back-end packaging.

What is claimed is:
1. A semiconductor light-emitting device, including:
   a light-emitting semiconductor structure, including:
      a first semiconductor layer;
      a second semiconductor layer, disposed opposite to the first semiconductor layer; and
      a light-emitting layer, disposed between the first semiconductor layer and the second semiconductor layer;

a transparent dielectric pattern, disposed above the light-emitting semiconductor structure; and an electrode pattern, disposed above the transparent dielectric pattern, wherein a cave is formed between the transparent dielectric pattern and the light-emitting semiconductor structure, and is located opposite to the electrode pattern, wherein a transverse section width of the cave is not less than a corresponding transverse section width of the electrode pattern.

2. The semiconductor light-emitting device of claim 1, further including a transparent conductive layer disposed between the transparent dielectric pattern and the electrode pattern, wherein the transparent conductive layer covers the transparent dielectric pattern, the cave and the light-emitting semiconductor structure.

3. The semiconductor light-emitting device of claim 2, wherein the cave is structured by a top cover portion formed by the transparent dielectric pattern, a side wall portion formed by the transparent dielectric pattern, and the light-emitting semiconductor structure.

4. The semiconductor light-emitting device of claim 3, wherein the cave includes an opening, and an opening direction of the opening is intersected with a direction perpendicular to the light-emitting layer.

5. The semiconductor light-emitting device of claim 2, wherein the cave includes an opening, and an opening direction of the opening is intersected with a direction perpendicular to the light-emitting layer.

6. The semiconductor light-emitting device of claim 1, wherein the cave is structured by a top cover portion formed by the transparent dielectric pattern, a side wall portion formed by the transparent dielectric pattern, and the light-emitting semiconductor structure.

7. The semiconductor light-emitting device of claim 6, wherein the cave includes an opening, and an opening direction of the opening is intersected with a direction perpendicular to the light-emitting layer.

8. The semiconductor light-emitting device of claim 1, wherein the cave includes an opening, and an opening direction of the opening is intersected with a direction perpendicular to the light-emitting layer.

9. A semiconductor light-emitting device, including:
a light-emitting semiconductor structure, including:
a first semiconductor layer;
a second semiconductor layer, disposed opposite to the first semiconductor layer; and
a light-emitting layer, disposed between the first semiconductor layer and the second semiconductor layer;
a transparent dielectric pattern, disposed above the light-emitting semiconductor structure; and
an electrode pattern, disposed above the transparent dielectric pattern, wherein a plurality of caves is formed between the transparent dielectric pattern and the light-emitting semiconductor structure, and is located opposite to the electrode pattern, wherein the caves are arranged in equidistant interval or non-equidistant interval.

10. The semiconductor light-emitting device of claim 9, wherein each of the caves is structured by a top cover portion formed by the transparent dielectric pattern, a side wall portion formed by the transparent dielectric pattern, and the light-emitting semiconductor structure.

11. The semiconductor light-emitting device of claim 10, wherein each of the caves includes an opening, and an opening direction of the opening is intersected with a direction perpendicular to the light-emitting layer.

12. The semiconductor light-emitting device of claim 11, further including a transparent conductive layer disposed between the transparent dielectric pattern and the electrode pattern, wherein the transparent conductive layer covers the transparent dielectric pattern, the caves and the light-emitting semiconductor structure.

13. The semiconductor light-emitting device of claim 10, further including a transparent conductive layer disposed between the transparent dielectric pattern and the electrode pattern, wherein the transparent conductive layer covers the transparent dielectric pattern, the caves and the light-emitting semiconductor structure.

14. The semiconductor light-emitting device of claim 9, wherein each of the caves includes an opening, and an opening direction of the opening is intersected with a direction perpendicular to the light-emitting layer.

15. The semiconductor light-emitting device of claim 14, further including a transparent conductive layer disposed between the transparent dielectric pattern and the electrode pattern, wherein the transparent conductive layer covers the transparent dielectric pattern, the caves and the light-emitting semiconductor structure.

16. The semiconductor light-emitting device of claim 9, further including a transparent conductive layer disposed between the transparent dielectric pattern and the electrode pattern, wherein the transparent conductive layer covers the transparent dielectric pattern, the caves and the light-emitting semiconductor structure.

17. A semiconductor light-emitting device, including:
a light-emitting semiconductor structure, including:
a first semiconductor layer;
a second semiconductor layer, disposed opposite to the first semiconductor layer; and
a light-emitting layer, disposed between the first semiconductor layer and the second semiconductor layer;
a first transparent dielectric pattern, disposed above the first semiconductor layer;
a second transparent dielectric pattern, disposed above the second semiconductor layer;
a first electrode, disposed above the first transparent dielectric pattern; and
a second electrode, disposed above the second transparent dielectric pattern and distinct from the first electrode, wherein a first cave located opposite to the first electrode is formed between the first transparent dielectric patterns and the light-emitting semiconductor structure, and a second cave located opposite to the second electrode is formed between the second transparent dielectric pattern and the light-emitting semiconductor structure.

18. The semiconductor light-emitting device of claim 17, further including a transparent conductive layer disposed between the first transparent dielectric pattern and the first electrode, wherein the transparent conductive layer covers the first transparent dielectric pattern and the first semiconductor layer.

19. The semiconductor light-emitting device of claim 17, wherein an opening direction of the first cave is perpendicular to an extended tangent direction of a corresponding portion of the first electrode.

20. The semiconductor light-emitting device of claim 17, wherein an opening direction of the second cave is parallel to an extended tangent direction of a corresponding portion of the second electrode.

* * * * *